United States Patent
Van Gastel

(10) Patent No.: US 8,410,932 B2
(45) Date of Patent: Apr. 2, 2013

(54) CAPACITIVE SENSOR ARRANGEMENT WITH A SENSOR ELECTRODE, A SCREEN ELECTRODE AND A BACKGROUND ELECTRODE

(75) Inventor: Peter Van Gastel, Solingen (DE)

(73) Assignee: Huf Hulsbeck & Furst GmbH & Co. KG, Velbert (DE)

( * ) Notice: Subject to any disclaimer, the term of this patent is extended or adjusted under 35 U.S.C. 154(b) by 469 days.

(21) Appl. No.: 12/828,921

(22) Filed: Jul. 1, 2010

(65) Prior Publication Data

US 2011/0001549 A1 Jan. 6, 2011

(30) Foreign Application Priority Data

Jul. 3, 2009 (DE) .......................... 10 2009 031 824

(51) Int. Cl.
*G08B 13/00* (2006.01)
(52) U.S. Cl. .................. 340/541; 340/545.2; 340/545.4; 340/561; 341/173; 324/658; 324/678; 324/688
(58) Field of Classification Search ............... 340/545.2, 340/545.4, 561, 562; 345/173; 361/181; 324/658, 686–688, 678
See application file for complete search history.

(56) References Cited

U.S. PATENT DOCUMENTS

| | | | |
|---|---|---|---|
| 6,445,294 | B1 | 9/2002 | McDonnell et al. |
| 7,262,609 | B2 | 8/2007 | Reynolds |
| 7,521,942 | B2 | 4/2009 | Reynolds |
| 2007/0268026 | A1 | 11/2007 | Reynolds |
| 2008/0042660 | A1 | 2/2008 | Ely et al. |
| 2008/0278453 | A1 | 11/2008 | Reynolds et al. |
| 2009/0039902 | A1 | 2/2009 | Hargreaves et al. |
| 2009/0174416 | A1 | 7/2009 | Ely et al. |
| 2009/0206852 | A1 | 8/2009 | Reynolds |

FOREIGN PATENT DOCUMENTS

GB 2404443 2/2005

*Primary Examiner* — Daniel Wu
*Assistant Examiner* — Frederick Ott
(74) *Attorney, Agent, or Firm* — Blakely, Sokoloff, Taylor & Zafman

(57) ABSTRACT

A capacitive sensor array including a sensor electrode which detects the intrusion of an object, a shield electrode and a background electrode. A control and evaluation circuit is coupled to the sensor electrode which detects a change in the capacitance of the sensor electrode. The sensor electrode periodically evaluates at least one of a current and voltage profile to detect the capacitance change. The shield electrode is coupled to the sensor electrode through the control and evaluation circuit such that it has no influence on the measured capacitance. The background electrode is controlled such that its potential is periodically switched between the reference potential and a second potential. When the sensor electrode is coupled with the first potential, the background electrode may be located on the reference potential. When the sensor electrode is not coupled with the first potential, the background electrode may be located on the second potential.

13 Claims, 4 Drawing Sheets

CAPACITIVE SENSOR ARRANGEMENT WITH A SENSOR ELECTRODE, A SCREEN ELECTRODE AND A BACKGROUND ELECTRODE

BACKGROUND OF THE INVENTION

The invention relates to a capacitive sensor array having a sensor electrode which enables the detection of the intrusion of an object into a space in front of the sensor electrode, and a control and evaluation circuit coupled with the sensor electrode that detects a change in the capacitance of the sensor electrode compared to a reference potential by periodically and repeatedly coupling the sensor electrode, at a predetermined frequency, with a predetermined first potential and evaluating at least one parameter of a current or voltage profile dependent on the periodic charging and discharging of the sensor electrode for detecting the capacitance change.

A capacitive sensor array of the type named in the introduction in which the reference potential is a ground potential and the first potential is an operational voltage potential and in which the parameter of a current or voltage profile dependent on the periodic charging and discharging of the sensor electrode is a voltage that can be measured over a capacitor, which voltage depends on the charge accumulated on the capacitor, wherein this charge is accumulated by charging the sensor electrode by periodically and repeatedly coupling it with a power supply potential and then discharging it by coupling it with the capacitor, is known, for example, from the U.S. Pat. No. 5,730,165 or the corresponding patent DE 196 81 725 B4. Another such capacitive sensor is known from the patent EP 1 339 025 B1.

A capacitive sensor array having a sensor electrode, with a ground-background electrode arranged at a distance behind the sensor electrode and with a shield electrode which is arranged between the sensor electrode and the ground-background electrode and is connected via a control and evaluation circuit coupled in such a manner with the sensor electrode that it has no influence on the capacitance of the sensor electrode measured against the ground and that its potential is adjusted to the potential of the sensor electrode is known, for example, from the publications EP 0 518 836 A1, U.S. Pat. No. 6,825,752 B2, DE 101 31 243 C1 and DE 10 2006 044 778 A1. This provision of a shield electrode between the sensor electrode and the background electrode located on a ground potential which is known from these documents has the advantage that the sensitivity of the thus formed capacitive sensor to changes in the area in front of the sensor electrode is increased, for example, by the insertion of objects. This is mainly due to the fact that the field extending out from the sensor electrode extends more in the space in front of the sensor electrode because a large part of the field is no longer short-circuited to the background electrode located on the ground potential, as it is when there is no shield electrode. Due to the fact that the shield electrode is coupled with the sensor electrode in such a way that its potential is adjusted, a strong electric field builds up between the shield electrode and the background electrode; above all, however, there is virtually no build-up of a field between the sensor electrode and the shield electrode adjusted according to potential.

SUMMARY OF THE INVENTION

It is the object of the invention to better isolate the spatial area in which the capacitive sensor array can detect the intrusion of a given object, that is, the detection area, for example, to achieve a better alignment.

This task is achieved according to the invention by a capacitive sensor array with the features of Claim 1. The capacitive sensor array according to the invention includes a sensor electrode which enables the detection of the intrusion of an object in a space in front of the sensor electrode, at least one background electrode which is arranged at a distance behind the sensor electrode, and a shield electrode. A control and evaluation circuit coupled with the sensor electrode detects a change in the capacitance of the sensor electrode in comparison to a reference potential, preferably a ground potential, by coupling the sensor electrode with a predetermined frequency periodically and repeatedly with a predetermined first potential, such as an operating voltage potential, and evaluating at least one parameter of a current and voltage profile dependent on the periodic charging and discharging of the sensor electrode for detecting the change in capacitance. The voltage profile can be the voltage profile at the connection of the sensor electrode, for example. The parameter may, for example, be a voltage that is measured by a charge accumulating capacitor, or a certain number of periods of charging and discharging up to the exceeding of a switching threshold by a voltage measured at the sensor electrode. The shield electrode is coupled with the sensor electrode through the control and evaluation circuit so that it has no influence on the capacitance of the sensor electrode measured against the reference potential and its potential is essentially adjusted to the potential of the sensor electrode. It should be clarified here that the concept of "adjustment" means that the potential of the shield electrode does not need to be equal to the potential of the sensor electrode and that there may be a time lag between the course of the potential of the sensor electrode and the potential of the shield electrode. The word "essentially" means that the shield electrode does not have to match the potential of the sensor electrode over the full periods of charging and discharging of the sensor electrode; it is sufficient if it matches this potential at least during some segments of the periods, for example during the discharging of the sensor electrode whose potential it is matching and during the discharging of the sensor electrode which the ground reference potential de-energizes, while the potential of the sensor electrode continues to lie on a potential that is different from that of the ground. The background electrode, or at least one of the background electrodes, is coupled with the control and evaluation circuit, so that its potential is periodically switched, at the given frequency, between the reference potential and a second potential, which, compared to the reference potential, has the same polarity as the first potential, wherein the background electrode lies on the reference potential at least during a part of those times in which the sensor electrode is coupled with the first potential, and at least during a part of those times in which the sensor electrode is not coupled with the first potential on which the second potential lies. The second potential may in turn be the operating voltage or even a different (smaller or larger) voltage. Indeed, in a preferred embodiment, the potential profile of the background electrode is complementary to that of the sensor electrode and the shield electrode; however, in other embodiments, there may be both a time delay between the switching of the sensor electrode and the switching of the background electrode and a different duty cycle when switching.

The invention is based on the basic idea that, instead of using a background electrode that is always located on a constant ground and operating voltage potential, rather using a background electrode that switches complementarily between the ground potential and the operational voltage potential during switching of the sensor electrode between the charging and discharging state, wherein embodiments in which the switching takes place with a time delay, with differing duty cycle or with differing potentials are also to be covered.

In the preferred embodiment of the capacitive sensor array, the reference potential is the ground, and the first potential and the second potential correspond to the potential of a supply voltage of the control and evaluation circuit with respect to the ground. In the preferred embodiment, the background electrode is controlled so that the potential of the background electrode is placed on the reference potential, preferably the ground, during those times when the sensor electrode is located on the first potential, that is, preferably on the power supply. The background electrode is preferably also controlled so that the potential of the background electrode is located on the second potential during those times when the sensor electrode is not located on the first potential, that is, preferably not located on the operating voltage. Preferably, the background electrode is controlled so that the potential of the background electrode is switched at the same duty cycle to the reference potential with which the sensor electrode is connected to the first potential. In the preferred embodiment, the duty cycle is 50% and the two electrodes are switched synchronously. For this reason, the background electrode in the preferred embodiment is called a "complementary electrode".

Embodiments are conceivable in which several adjacent background electrodes are located behind the shield electrode and the sensor electrode, of which at least one is coupled with the control and evaluation circuit and is controlled so that its potential is periodically switched at the given frequency between the reference potential and the second potential. The other background electrodes can be located on the reference potential, for example. An additional electrode could also be provided behind the background electrode and located on a constant potential, such as on the ground.

The frequency with which the sensor electrode is periodically and repeatedly coupled with a given first potential, for example with an operating voltage, lies for example in the range between 50 kHz and 5 MHz, preferably between 125 kHz and 1 MHz.

A further embodiment of the capacitive sensor array according to the invention is characterized by the fact that the sensor electrode, a reference capacitor connected with the sensor electrode, the shield electrode and the background electrode are each connected with at least one output port of a microcontroller, wherein the microcontroller is in the evaluation and control circuit and can couple or, in response to high resistance, decouple the electrodes over the ports, either with an operating voltage or with the ground, so that the microcontroller, controlled by a program, alternately places the port of the sensor electrode on the operating voltage and decouples it in response to high resistance, essentially synchronously decouples the port of the reference capacitor in response to high resistance with the port of the sensor electrode and places it on the ground, adjusts the shield electrode to the potential of the sensor electrode in that it alternately places the port of the shield electrode synchronously with the port of the sensor electrode on the operating voltage and the ground and switches the port of the background electrode between ground and operating voltage, wherein the port of the background electrode is located on the ground at least during a part of those times in which the port of the sensor electrode is located on the operating voltage, and is located on the operating voltage at least during a part of those time in which the port of the sensor electrode is not located on the operating voltage. In a further development of this preferred embodiment, both the shield electrode and the complementary electrode are each coupled with two ports of the microcontroller, wherein one port is used to place the corresponding electrode on operating voltage, while the other port is used to place the corresponding electrode on the ground. This leads to a higher switching speed.

In a preferred embodiment of the latter development, the port of the sensor electrode also features an input port with an A/D converter, which is then activated if the output port is decoupled in response to high resistance. This allows the input port to measure the charge accumulated on the reference capacitor in the form of the applied voltage, wherein the A/D converter outputs a digital value corresponding to this voltage. The given digital value is then compared, for example, with a reference digital value corresponding to a predetermined voltage threshold.

One embodiment of the above-described sensor array could, for example, be arranged in the rear bumper of a motor vehicle and selectively detect the approach of a user body part (foot) and, subject to this, release a trunk lock.

Further advantageous and/or preferred embodiments of the invention are characterized in the subclaims.

BRIEF DESCRIPTION OF THE DRAWINGS

The invention is explained in more detail below by the preferred embodiments illustrated in the drawings. In the drawings.

DETAILED DESCRIPTION OF THE INVENTION

Figure 1:
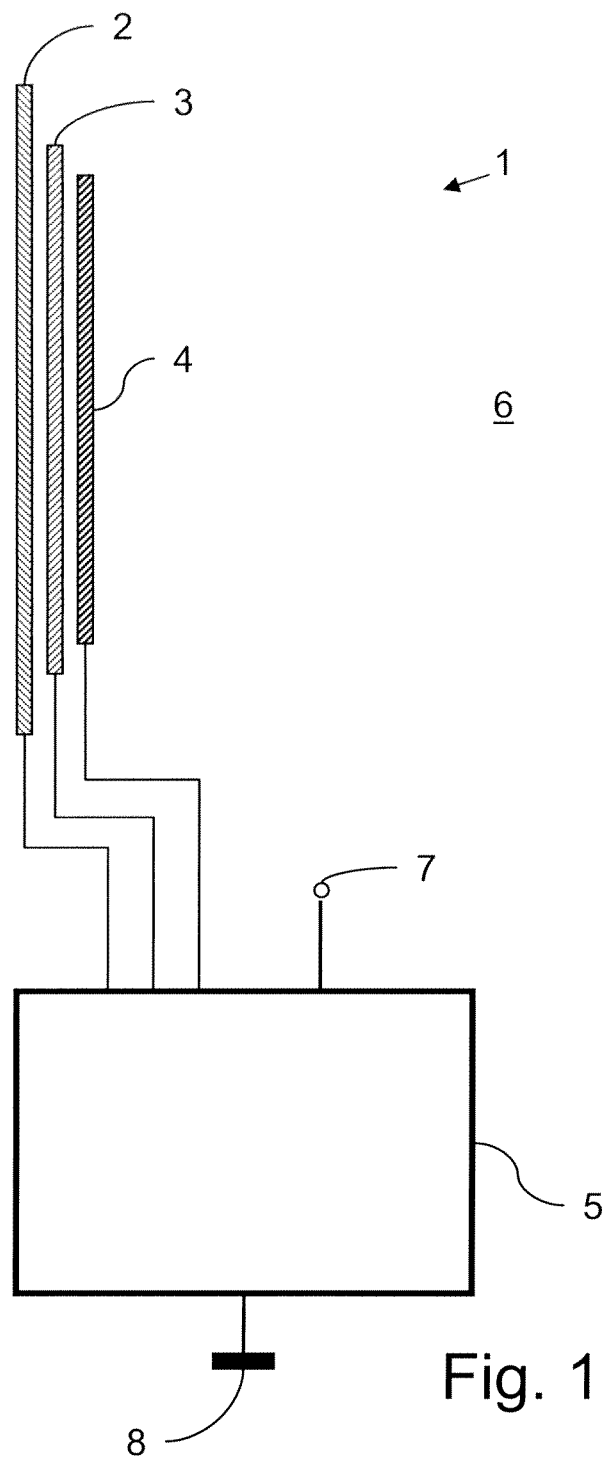
FIG. 1 shows a schematic representation of the arrangement of three electrodes of the preferred embodiment of the capacitive sensor array and its coupling with a control and evaluation circuit.

FIG. 1 shows a schematic representation of the capacitive sensor array according to the invention which includes a sensor electrode array 1 and a control and evaluation circuit 5. The individual electrodes of the sensor electrode array 1 are coupled via signal lines to the control and evaluation circuit 5, wherein the control and evaluation circuit may also include several structurally separate components, which are arranged at different locations. Those components of the control and evaluation circuit 5 which charge the electrodes of the sensor electrode array 1 with predetermined voltages and detect the voltage potentials of individual sensor electrodes are preferably arranged in the vicinity of the sensor electrode array 1 in order to keep the lead lengths short and the parasitic capacitances as low as possible.

The sensor electrode array 1 is preferably arranged on an object surface, in front of which a space 6 to be monitored is located, wherein the capacitive sensor array is to detect the penetration of an object into this space 6. The dimensions of this space 6 depend partly on the size and shape of the sensor electrode array 1 and partly on the sensitivity of the control and evaluation circuit 5 coupled with the sensor electrode array 1. The sensor electrode array 1 can, for example, be arranged on or immediately behind a vehicle surface component, such as a door handle, to detect the penetration of a user body part into the space 6 in front of the sensor electrode array 1. For example, certain switching operations or other processes are triggered in the motor vehicle if the penetration of an operator body part into the space 6 is detected by the sensor electrode array 1.

The sensor electrode array 1 shown in FIG. 1 includes first a sensor electrode 4 intended to help detect the penetration of an object into the space 6. The control and evaluation circuit 5 coupled with the sensor electrode 4 by a signal line detects a change in the capacitance of the sensor electrode in comparison to a reference potential, preferably in comparison to the ground, by periodically and repeatedly coupling the sensor electrode 4, at a given frequency, with a predetermined first potential, such as the operating voltage, and evaluates at least one parameter of a current or voltage profile dependent on the periodic charging and discharging of the sensor electrode 4 for the detection of change in capacitance. How this is done in a preferred embodiment is explained below using FIG. 2.

The sensor electrode array 1 also comprises a shield electrode 3, which is arranged at a distance behind the sensor electrode 4, and a background electrode 2, which in turn is arranged at a distance behind the shield electrode 3. The shield electrode 3 is coupled with the sensor electrode 4 through the control and evaluation circuit 5 in such a way that it has no influence on the capacitance of the sensor electrode 4 measured in comparison to the reference potential (the ground, for example), and that its potential is adjusted to the potential of the sensor electrode 4. How this is implemented in the preferred embodiment is also described in more detail below in FIG. 2.

The background electrode 2 is controlled in such a ways that its potential is periodically switched, at the same predetermined frequency, between the reference potential (the ground, for example) and a second potential. The second potential has the same polarity as the reference potential and can, for example, also be equal to the first potential. At least during part of those times when the sensor electrode 4 is coupled with the first potential, the background electrode is located on the reference potential, for example, the ground. At least during part of those times when the sensor electrode 4 is not coupled to the first potential, the background electrode 2 is located on the second potential. This, too, is described in detail for a preferred embodiment in FIG. 2.

The sensor electrode array 1 with a background electrode 2, shield electrode 3 and the sensor electrode 4 can be of different designs. Parallel flat-plate electrodes do not need to be used; the electrodes can also be curved, for example. The size of the electrodes depends on the respective application. For example, if a relatively small space 6 is to be monitored in the immediate vicinity of a sensor surface of limited dimensions, as could be the case, for example, with a touch switch on a door handle, then the dimensions of the sensor electrode 4 and the shield electrode 3 located behind that and the background electrode 2 are also relatively small. The electrodes can be made of any conductive material; for example, it may consist of metallization planes of a multi-layer printed circuit board. The sensor electrodes 2, 3 and 4 are separated by insulating layers from each other, wherein the insulator layers may comprise, for example, plastic.

The power supply of the control and evaluation circuit 5 is symbolized in FIG. 1 by the supply voltage terminal 7 and the ground connector 8. Naturally, embodiments are also conceivable in which several different supply voltages are fed into the control and evaluation circuit 5.

Figure 2:
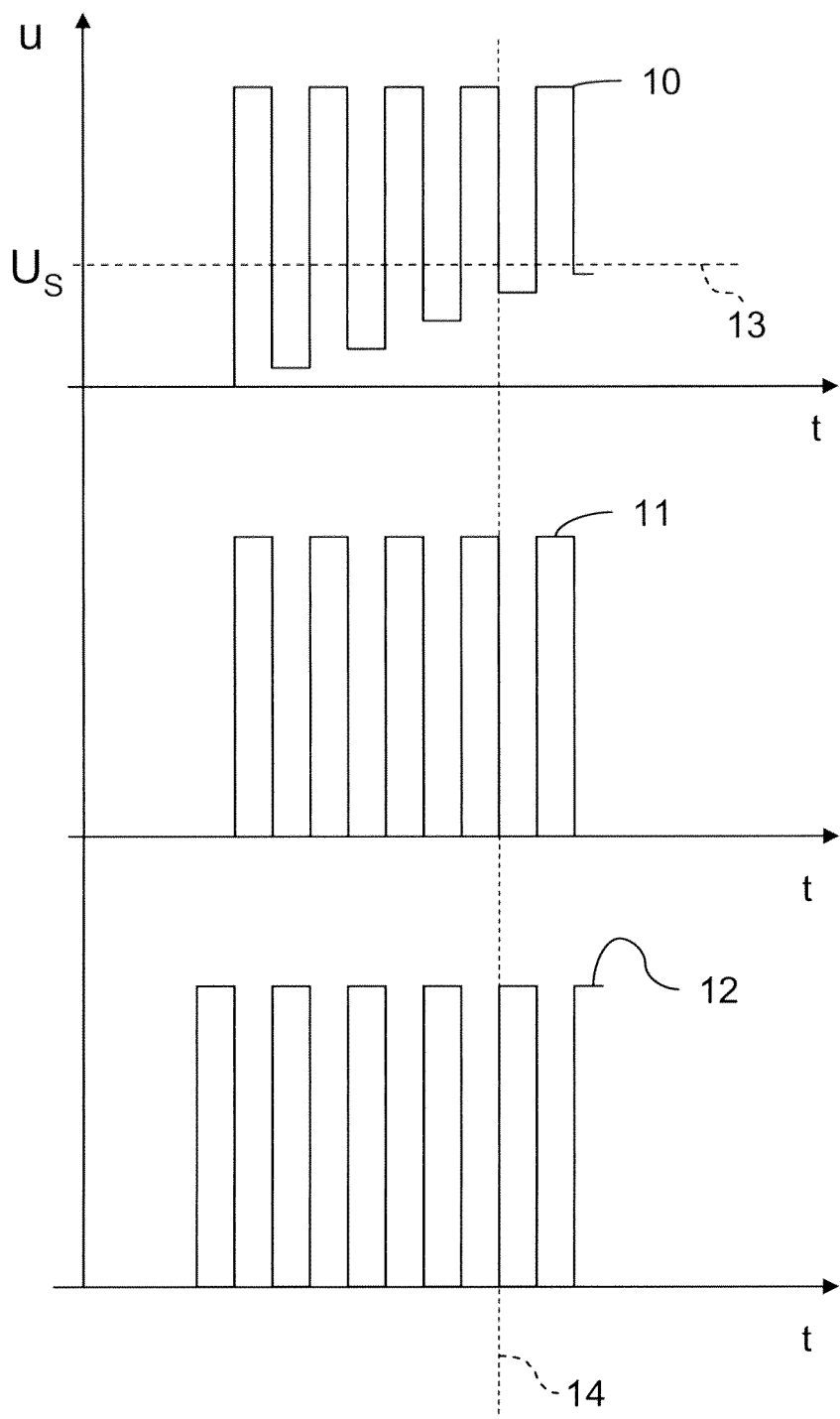
FIG. 2 shows a schematic representation of the potential profiles on the sensor electrode, the shield electrode and the background electrode in the preferred embodiment.

FIG. 2 shows schematically which voltage profiles (or potential profiles in relation to a reference potential, such as the ground) go with which electrodes based on the control by the control and evaluation circuit 5. The above described profile 10 shows the potential profile at the sensor electrode 4. In this embodiment, the sensor electrode 4 is connected periodically and repeatedly, for a predetermined time, to an operating voltage so that the potential of the potential profile 10 increases to the high operating voltage during these times and stays there for the duration of the connection to the operating voltage. This charges the sensor electrode, which has a capacitance compared to the ground reference potential. Each time, during the second half of each period, the sensor electrode 4 is coupled with an electrode of a reference capacitor, while the other electrode of the reference capacitor is coupled with the ground. In this process, a part of the charge accumulated on the sensor electrode 4 is transferred to the reference capacitor 4. The accumulated charge, and thus also the transferred charge, depend, for example, on whether there is an object in space 6 in front of the sensor electrode 4. In these time periods, the potential at the sensor electrode 4 and the voltage between the connection node between the sensor electrode 4 and the reference capacitor and ground drop to a value that is proportional to the charge transferred to the reference capacitor. The process of charging the sensor electrode 4 by connecting with the operating voltage and the discharging of the sensor electrode 4 over the reference capacitor is repeated several times, wherein any new charge is transferred each time from the sensor electrode 4 to the reference capacitor. This in turn means that the potential profile 10 slowly increases during the periods in which the potential is at a low level. As a result, a circuit associated with the connection node between the sensor electrode 4 and the reference capacitor detects whether this potential exceeds a threshold voltage $U_S$. Furthermore, the pulses which are necessary to effect the increase over the threshold voltage $U_S$ are counted. The number of these pulses is a measure of the capacitance of the sensor electrode 4 with respect to the reference potential (ground). If the sensor electrode has a relatively high capacitance compared to the ground because, for example, an object coupled with the ground has penetrated into the space 6 and is located near the sensor electrode 4, then only a relatively few pulses are necessary in order to cause the threshold value $U_S$ to be exceeded. If the sensor electrode 4 has a relatively low capacitance compared to the mass because, for example, the space 6 is empty, then relatively many pulses are necessary in order to cause the threshold value $U_S$ to be exceeded. After it has been determined that threshold has been exceeded, the measurement cycle begins anew by first discharging the reference capacitor. Then the cycles that are necessary to cause the voltage across the reference capacitor to exceed the threshold value $U_S$ are in turn counted.

Of course, in alternative embodiments, other procedures are also conceivable for detecting a change in capacitance of the sensor electrode 4 by evaluating a parameter of a current or voltage profile dependent on the periodic charging and discharging of the sensor electrode 4. For example, the reference capacitor could initially be charged at a fixed predetermined negative value and then be partly discharged by charge transfer from the sensor electrode 4 with each cycle. Also, the sensor electrode 4 can be charged by coupling with a power source for a predetermined period of time.

In the middle part of FIG. 2, the potential profile 11 is outlined on the shield electrode 3. It must be recognized that the potential of the shield electrode 3 is adjusted to the potential of the sensor electrode 4 so that when the sensor electrode is coupled with the first potential, for example with the operating voltage, the shield electrode is also coupled with this first potential so that the potential of the shield electrode 3 is brought synchronously with the potential of the sensor electrode 4 to the high level. In those intervals, then, in which the sensor electrode 4 is coupled through the reference capacitor to ground, the shield electrode 3 is, for example, directly coupled with the ground, so that the potential profile 11 drops to the ground reference potential. Strictly speaking, the potential of the shield electrode 3 is adjusted to the potential of the sensor electrode 4 only approximately; an exact adjustment only takes place here during those intervals in which both electrodes are placed on the high potential. During those intervals in which the shield electrode 3 is placed on the ground potential, it does not adjust to the potential of the sensor electrode 4, which increases slowly as a function of charging the reference capacitor until it exceeds the threshold $U_S$. However, this slow increase in the potential of the sensor electrode 4 during the interval sections with low potential is much lower than the height of the pulses, that is, as the first potential, such as the operating voltage. For this reason, we can speak of an adjustment during the entire potential profile 11 of the shield electrode 3.

The lower section of FIG. 2 shows the potential profile 12 for the background electrode 2. These are periodically and alternately connected to a high, first potential, such as the operating voltage, and then again to a low potential, such as a ground. However, the potential profile here is complementary to the potential profiles of the sensor electrode 4 and the shield electrode 3. Always then, whenever the sensor electrode 4 and the shield electrode 3 are placed on the high potential, the background electrode is placed on the low potential, in particular on the ground. Then, whenever the sensor electrode 4 is placed on a low potential and the shield electrode 3 is placed on the ground potential, the background electrode 2 is placed on the high potential, such as the operating voltage. To better identify this phase opposition of the potential profiles, the vertical line 14 was inserted in FIG. 2.

It has been shown that there is a greater directivity with respect to sensitivity distribution with such a complementary control of the background electrode 2 in contrast to a sensor array in which the background electrode 2 is placed constantly on the ground only. In contrast to the customary control of an electrode array, the detection range within which the penetration of a given object is detected by a given sensor array extends further into the space 6 in front of the sensor electrode 4 and less in a space behind the background electrode 2. The inventive control of the background electrode 2, a good separation and orientation of the field and the detection range is possible.

Figure 3:
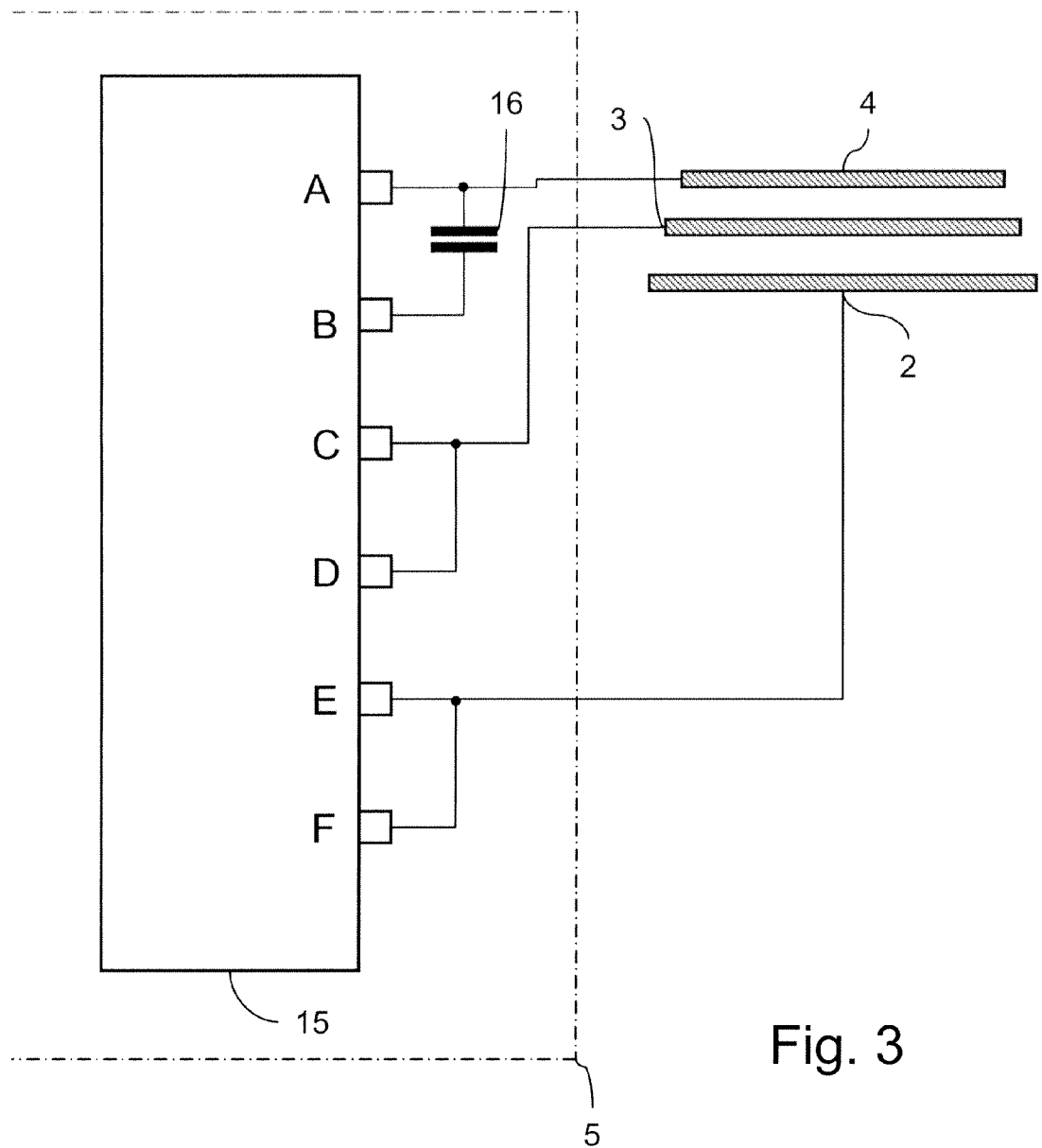
FIG. 3 shows a schematic representation of the preferred embodiment of the sensor array according to the invention in which the three electrodes are coupled with output ports of a microcontroller.

FIG. 3 shows a schematic representation of a preferred embodiment of the control and evaluation circuit 5 for sensor electrode array 1 consisting of the sensor electrode 4, the shield electrode 3 and the background electrode 2. The control and evaluation circuit 5 hereby comprises a microcontroller 15, which has at least six output ports that are labeled in FIG. 3 with the letters A-F. The sensor electrode 4 is coupled with the output port A. Furthermore, the reference capacitor 16 is coupled in between the output port A and the output port B. The shield electrode 3 is coupled with the output ports C and D, which are connected to each other. The background electrode 2 is connected with the output ports E and F, which are connected to each other. Each of the six output ports A-F is designed in such a way that it can connect its output terminal via a first electronic switch with an operating voltage or a second electronic switch to the ground. If both electronic switches are off, then the corresponding output terminal is located with high resistance on a floating potential, as long as it is not coupled via an external circuit with a different potential. Each of the output ports may, by executing a stored control software in the microcontroller 15, be brought into one of the three states of operating voltage, ground, or high resistance. In order to place one of the electrodes (for example, 2 or 3) alternately on the operating voltage and ground, it would be enough, theoretically, to couple the sensor electrode with one of the ports, wherein this output port is then connected alternately to the ground and supply voltage. But this would lead to relatively long switching times, when one and the same output port is alternately switched between the operating voltage and the ground. For this reason, in the preferred embodiment of the invention, each of the two electrodes 2 and 3 is each coupled with two output ports. One of the two output ports ensures that the corresponding electrode (2 or 3) can be placed on the operating voltage, while the other output port is responsible for coupling to ground. For example, while the output port C couples the electrode shield 3 with the operating voltage, the other output port D is in the high resistance state. Then, when the output port D subsequently couples the shield electrode 3 to the ground, the output port C is in the high resistance state. The same applies to the output ports E and F, which are connected to the background electrode 2.

The potential profile shown in FIG. 2 is generated with the help of the microcontroller control shown schematically in FIG. 3, in that the microcontroller sets the successive states of the output ports A to F by executing a control program. If the sensor electrode 4 is to be charged, then port A couples the supply line to the sensor electrode 4 with the operating voltage. At the same time, port C also couples the shield electrode 3 with the operating voltage. Port F couples the background electrode 2 to the ground. At the same time, the other ports B, D and E are in the high-resistance state. Then, when the accumulated charge on the sensor electrode is to be transferred in part to the reference capacitor 16, output port A is first shifted into the high-resistance state and then immediately couples output port B to the ground. At the same time, output port C is moved into the high-resistance state, and output port D is coupled to the ground, so that the shield electrode 3 adjusts to the sensor electrode 4. Also, at about the same time, output port F is moved into the high-resistance state and output port E is coupled with the supply voltage. In this embodiment, ports A, C and F and ports B, D and E preferably switch at approximately the same time. In an alternative embodiment, ports E and F or C and D can also be interchanged in terms of their control, of course. In other alternative embodiments, it is conceivable that the individual electrodes are in fact switched at the same fundamental frequency, but at different times. For example, the sensor array also functions even if the switching of the shield electrode 3 is offset slightly in comparison to the switching the sensor electrode. The same applies to the switching of the background electrode 2. In addition, the switching of the individual electrodes can follow the impulses with different duty cycles. This is illustrated by the different signal profiles shown in FIG. 4 for the background electrode.

Figure 4:
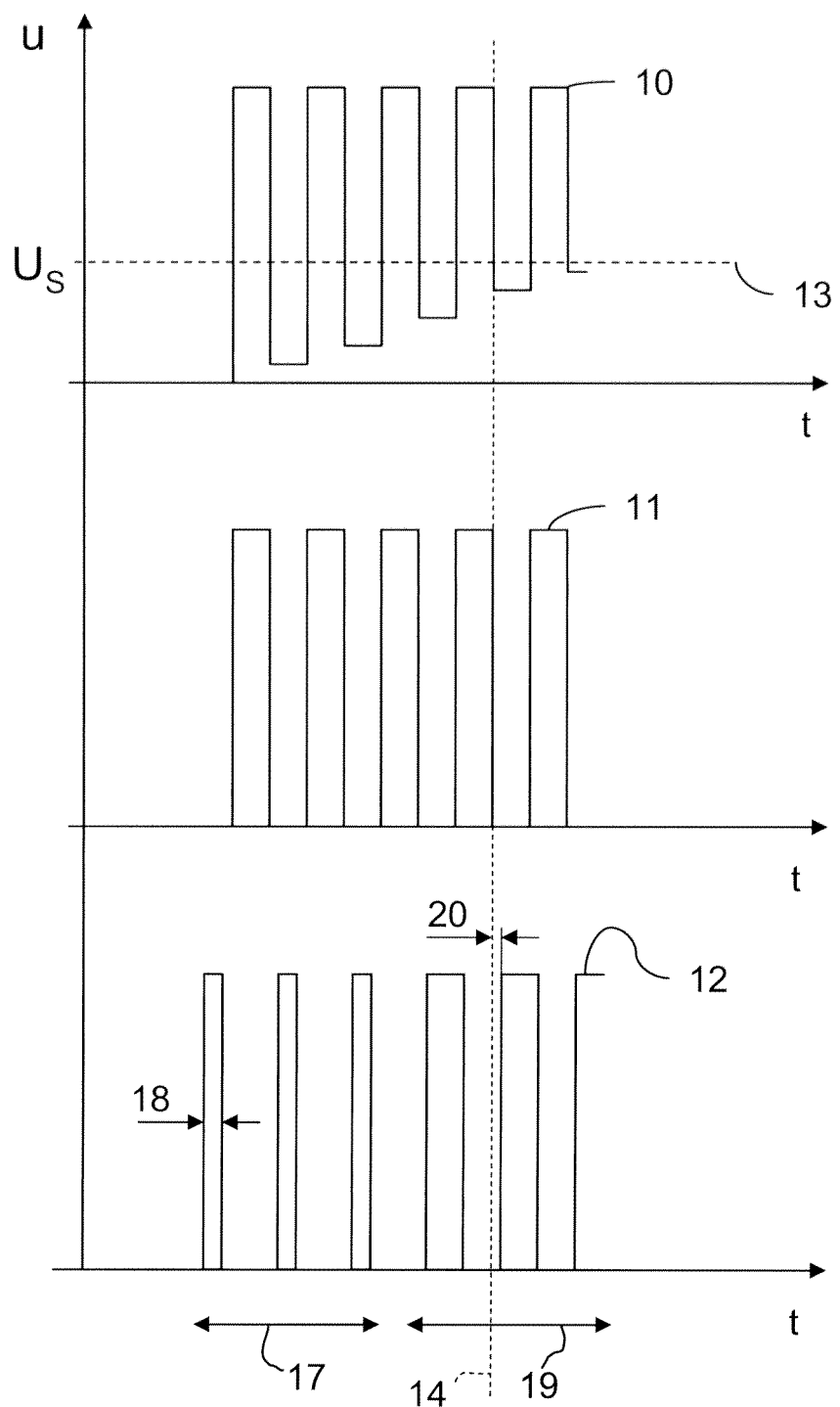
FIG. 4 shows potential profiles for the three electrodes with alternative controls of the background electrode.

FIG. 4, in turn, shows a schematic representation of the potential profiles, wherein the potential profile 10 of the sensor electrode 4 and the potential profile 11 of the shield electrode 3 which correspond to those of FIG. 2. The lower section of FIG. 4 shows possible potential profiles 12 of the background electrode 2 in alternative embodiments. In the time interval 17, a potential profile is shown in which those interval periods in which the background electrode is placed on the high potential of the operating voltage are shorter than the interval periods in which brought the shield electrode is brought to the ground and the sensor electrode is discharged through the reference capacitor. The width 18 of the pulses is narrower than the width of the pulses in the potential profiles 10 and 11. An alternative embodiment is indicated in the time interval 19 in which the pulse widths of the potential profiles 12, 11 and 10 are the same, but in which the pulses of the background electrode occur time delayed at a distance 20. This can be clearly recognized by the reference timeline 14. Despite this slight offset 20, the objective according to the invention of the improved spatial sensitivity is achieved.

I claim:

1. Capacitive sensor array with
   a sensor electrode, by which the intrusion of an object into a space in front of the sensor electrode is detected,
   a control and evaluation circuit coupled with the sensor electrode that detects a change in the capacitance of the sensor electrode in comparison to a reference potential, in that the sensor electrode, at a given frequency, periodically and repeatedly couples with a given first potential, and that evaluates at least one parameter of a current and voltage profile dependent on the periodic charging and discharging of the sensor electrode, for the detection of the capacitance change,
   at least one background electrode located a distance behind the sensor electrode, and
   a shield electrode which is arranged between the sensor electrode and the at least one background electrode and which is coupled with the sensor electrode through the control and evaluation circuit so that it has no influence on the measured capacitance of the sensor electrode in comparison to the reference potential and its potential essentially adjusts to the potential of the sensor electrode,
   wherein the background electrode, or at least one of the background electrodes, is coupled with the control and evaluation circuit and is controlled in such a way that its potential is periodically switched at the given frequency between the reference potential and a second potential which has the same polarity compared to the reference potential as the first potential, wherein the background potential is placed on the reference potential at least during a part of those times in which the sensor electrode is coupled with the first potential, and is placed on the second potential at least during a part of those times in which the sensor electrode is not coupled with the first potential.

2. Capacitive sensor array according to claim 1, wherein the reference potential is the ground.

3. Capacitive sensor array according to claim 2, wherein the first potential and the second potential correspond to the potential of a supply voltage of the control and evaluation circuit in comparison to the ground.

4. Capacitive sensor array according to claim 1, characterized in that the background electrode is controlled such that the potential of the background electrode is placed on the reference potential during those times in which the sensor electrode is located on the first potential.

5. Capacitive sensor array according to claim 1, characterized in that the background electrode is controlled such that the potential of the background electrode is located on the second potential during those times when the sensor electrode is not on the first potential.

6. Capacitive sensor array according to claim 1, characterized in that the background electrode is controlled such that the potential of the background electrode is switched, at the same duty ratio, to the reference potential with which the sensor electrode is switched to the first potential.

7. Capacitive sensor array according to claim 6, wherein the duty cycle is 50%.

8. Capacitive sensor array according to claim 1, characterized in that the background electrode and the sensor electrode are synchronously and complementarily switched.

9. Capacitive sensor array according to claim 1, characterized in that several side-by-side background electrodes are provided, arranged behind the sensor electrode and the shield electrode, one of which is coupled with the control and evaluation circuit and is controlled such that its potential is periodically switched, at the given frequency, between the reference potential and the second potential.

10. Capacitive sensor array according to claim 9, wherein the other background electrodes are coupled with the reference potential.

11. Capacitive sensor array according to claim 1, characterized in that the given frequency is in the range between 50 kHz and 5 MHz, preferably between 125 kHz and 1 MHz.

12. Capacitive sensor array according claim 1, characterized in that the sensor electrode, a reference capacitor connected with the sensor electrode, the shield electrode and the background electrode are each connected with an output port (A-F) of a microcontroller, wherein the microcontroller is part of the evaluation and control circuit and can couple or, in response to high resistance, decouple the electrodes over the ports (A-F), either with an operating voltage or with the ground, so that the microcontroller, controlled by a program,
    alternately places the port (A) of the sensor electrode on the operating voltage and decouples it in response to high resistance,
    alternately and essentially synchronously decouples the port (B) of the reference capacitor with the port (A) of the sensor electrode and places it on the ground,
    adjusts the shield electrode to the potential of the sensor electrode in that it alternately places the port (C, D) of the screen electrode synchronously with the port (A) of the sensor electrode on the operating voltage and on the ground, and
    switches the port (E, F) of the background electrode between the ground and operating voltage, wherein the port (E, F) of the background electrode is placed on the ground at least during a part of those times in which the port (A) of the sensor electrode is located on the operating voltage, and is placed on the operating voltage at least during a part of those times in which the port (A) of the sensor electrode is not located on the operating voltage.

13. Capacitive sensor array according to claim 12, characterized in that the port (A) of the sensor electrode also features an input port with an A/D converter, which is then activated if the output port is decoupled in response to high resistance.

* * * * *